United States Patent
Macerola et al.

(10) Patent No.: US 11,908,530 B2
(45) Date of Patent: Feb. 20, 2024

(54) MULTI-SAMPLED, CHARGE-SHARING THERMOMETER IN MEMORY DEVICE

(71) Applicant: Micron Technology, Inc., Boise, ID (US)

(72) Inventors: Agostino Macerola, San Benedetto dei Marsi (IT); Gianni Rea, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 17/684,956

(22) Filed: Mar. 2, 2022

(65) Prior Publication Data

US 2023/0111614 A1    Apr. 13, 2023

Related U.S. Application Data

(60) Provisional application No. 63/253,712, filed on Oct. 8, 2021.

(51) Int. Cl.

| | |
|---|---|
| *G11C 7/04* | (2006.01) |
| *G11C 16/32* | (2006.01) |
| *H03M 1/10* | (2006.01) |
| *G11C 16/04* | (2006.01) |
| *H03H 11/24* | (2006.01) |

(52) U.S. Cl.
CPC ............... *G11C 16/32* (2013.01); *G11C 7/04* (2013.01); *G11C 16/0483* (2013.01); *H03M 1/1009* (2013.01); *H03H 11/245* (2013.01)

(58) Field of Classification Search
CPC ........ G11C 16/32; G11C 7/04; G11C 16/0483
See application file for complete search history.

(56) References Cited

U.S. PATENT DOCUMENTS

| | | | | |
|---|---|---|---|---|
| 6,002,355 A | * | 12/1999 | Del Signore | H03M 1/12 341/172 |
| 7,706,545 B2 | * | 4/2010 | Kost | H04L 7/02 381/94.8 |
| 2020/0333197 A1 | * | 10/2020 | Vaiana | G01K 7/34 |

* cited by examiner

*Primary Examiner* — Jay W. Radke
(74) *Attorney, Agent, or Firm* — Lowenstein Sandler LLP

(57) ABSTRACT

A memory device includes an array of memory cells, a diode having a threshold voltage that changes with temperature, an analog-to-digital converter (ADC), and a pulse generator. The ADC includes a voltage comparator having a positive terminal coupled with the diode. The ADC further includes a first capacitor coupled between a negative terminal of the voltage comparator and ground, and a second capacitor selectively coupled between the first capacitor and a voltage reference node. The second capacitor has a smaller capacitance than that of the first capacitor. The pulse generator is coupled with the ADC and generates pulses. The pulses cause the first capacitor to connect to the second capacitor and equalize charge between the first capacitor and the second capacitor. An inverted signal of the pulses causes the second capacitor to be coupled with the voltage reference node to pre-charge the first capacitor.

20 Claims, 10 Drawing Sheets

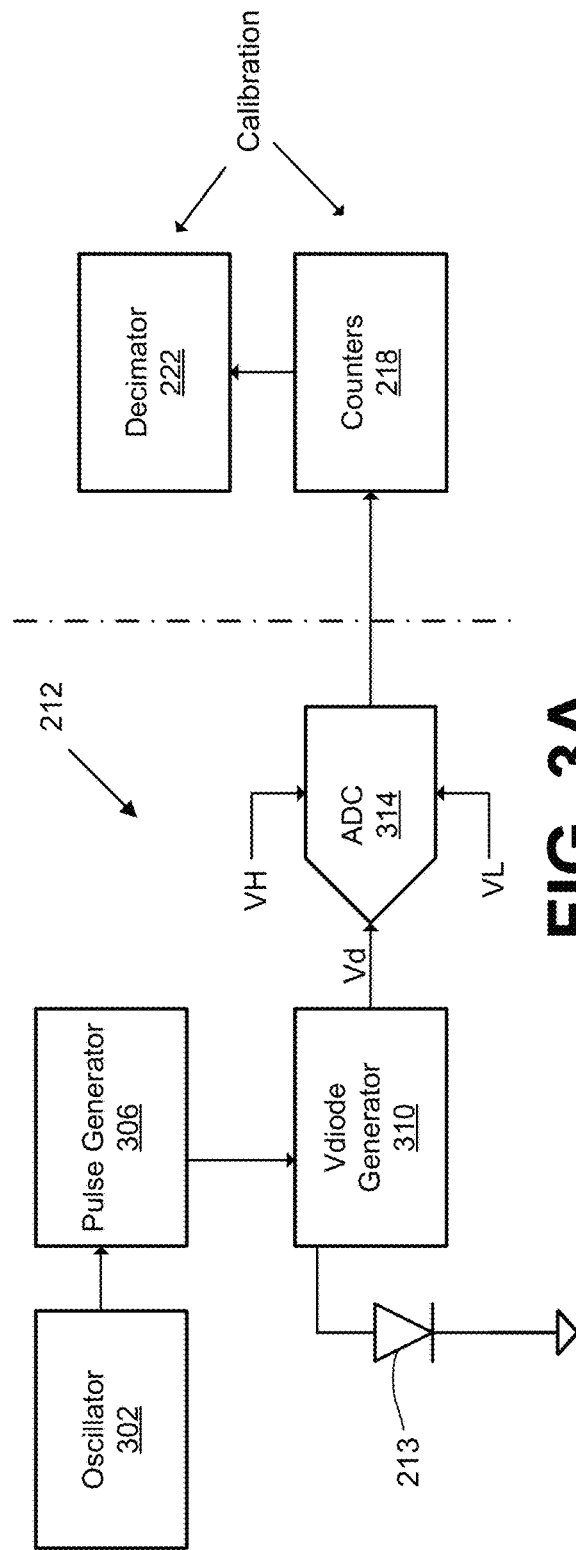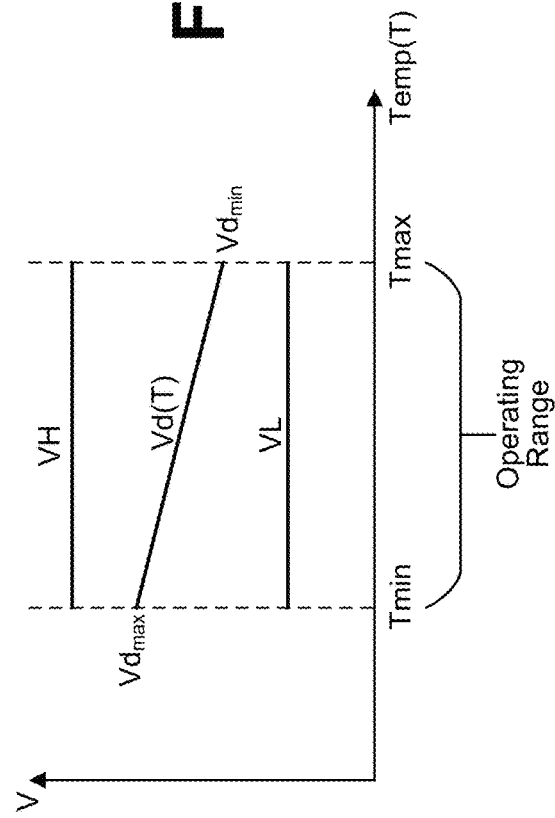
FIG. 3A
FIG. 3B

600

---

Direct a pulse generator to generate pulses, wherein the pulses are to cause the first capacitor to connect to the second capacitor and equalize charge between the first capacitor and the second capacitor.
610

↓

Generate, from the pulses, an inverted signal that is to cause the second capacitor to be coupled to the voltage reference node to precharge the first capacitor before equalization of the charge between the first capacitor and the second capacitor.
620

↓

Track a number of one values output by the voltage comparator to determine a temperature value of the diode.
630

FIG. 6

MULTI-SAMPLED, CHARGE-SHARING THERMOMETER IN MEMORY DEVICE

REFERENCE TO RELATED APPLICATION

This application claims the benefit of U.S. Provisional Patent Application No. 63/253,712, filed Oct. 8, 2021, the entirety of which is incorporated herein by reference.

TECHNICAL FIELD

Embodiments of the disclosure are generally related to memory sub-systems, and more specifically, relate to multi-sampled, charge-sharing thermometer in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3A is a schematic block diagram of the conversion circuitry in the context of the thermometer of FIG. 2A according to at least some embodiments.

FIG. 3B is a graph illustrating a threshold voltage of a diode that changes with respect to temperature within the thermometer according to at least some embodiments.

FIG. 6 is a flow diagram of an example method of operating the thermometer of the memory device according to at least some embodiments.

DETAILED DESCRIPTION

Figure 1A:
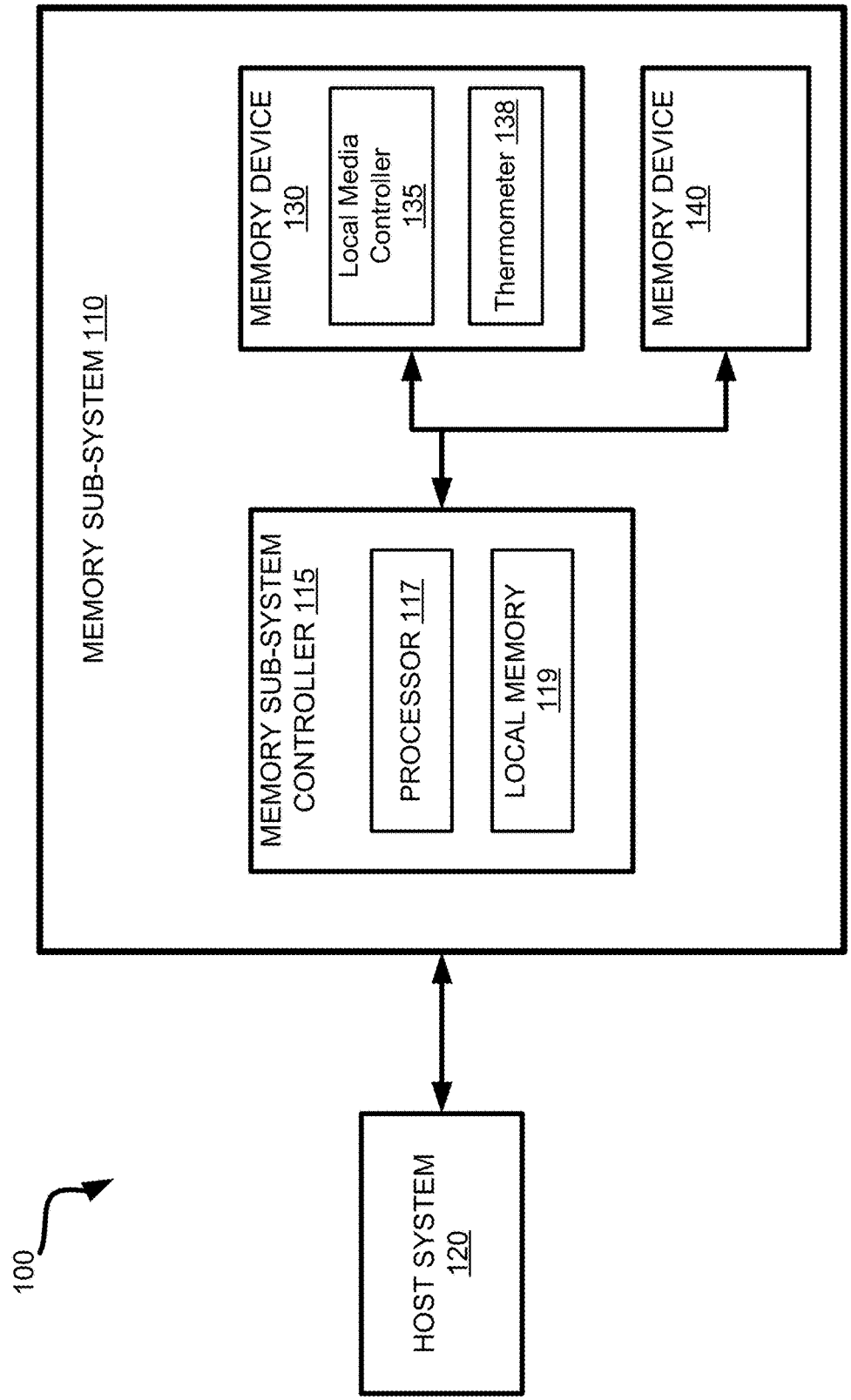
FIG. 1A illustrates an example computing system that includes a memory sub-system in accordance with some embodiments.

Embodiments of the present disclosure are directed to a multi-sampled, charge-sharing thermometer in a memory device. In certain memory devices, temperature changes the physical behaviors of programmable memory cells in memory devices. Some temperature techniques have been developed to improve the performance of these memory devices, such as negative-and (NAND) or flash memory device or the like, where these techniques rely on temperature readings. An internal thermometer or other temperature sensor provides a digital code proportional to the actual temperature.

In some memory devices, a thermometer can provide the digital code when a controller or other control logic requests a temperature value. In this implementation, the memory device incurs a performance penalty in having to wait for the thermometer to determine and provide the digital code. In other implementations, the thermometer can provide the digital code continuously in the background such that the digital code corresponding to the temperature value is always current and available. The risk with the latter implementation is acquiring the digital code during noisy phases of operation that causes conversion error. If the digital code is inaccurate as a result, the performing-enhancing technique can be degraded.

Aspects of the present disclosure address the above and other deficiencies through providing a thermometer that generates the digital code via averaging temperature conversions performed via repetition of a significant number (e.g., thousands) of conversion phases. For example, temperature variations during normal operation of memory devices tend to be relatively slow, e.g., less than 10° C. per second in practical situations. Thus, a conversion duration of between 20-30 ms is fast enough to provide up-to-date temperature information. In some embodiments, one or more thousands of conversion phases can be repeated to average the effect of any random noise. The circuit disclosed herein can also be configured to allow the recovery and elimination of systematic errors through calibration of the disclosed thermometer.

In some embodiments, a memory device includes an array of memory cells, a diode having a threshold voltage that changes with temperature, and an analog-to-digital converter (ADC) coupled with the array. The ADC can further include a voltage comparator having a positive terminal coupled with the diode, a first capacitor coupled between a negative terminal of the voltage comparator and ground, and a second capacitor selectively coupled between the first capacitor and a voltage reference node. The second capacitor is also coupled with the ground and has a smaller capacitance than that of the first capacitor. The memory device can further include a pulse generator, which is coupled with the ADC, and that generates pulses. In at least some embodiments, the pulses cause the first capacitor to connect to the second capacitor and equalize charge between the first capacitor and the second capacitor. Further, an inverted signal of the pulses causes the second capacitor to be coupled with the voltage reference node to pre-charge the first capacitor. A set of counters can then count a number of clock cycles and a number of ones output by the comparator. In response to the number of clock cycles reaching a predetermine number, the number of ones can be converted into a temperature value (or digital code), e.g., after being decimated by a decimator to remove the previously discussed noise.

Therefore, advantages of the systems and methods implemented in accordance with some embodiments of the present disclosure include, but are not limited to, providing a device, system, and method by which a thermometer of a memory device can continuously and accurately generate a temperature value that can be used in performance-enhancing techniques of the memory device. Further, the circuitry can be configured so that noise that may exist within the circuitry over time can be captured and eliminated, enabling multiple samples that are averaged over time to result in accurate temperature readings. Other advantages will be apparent to those skilled in the art of temperature value optimization within a memory device discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more memory dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are etched onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a thermometer 138, which can be adapted to take multiple samples over a series of clock cycles, and average outputs over time in order to continuously provide accurate temperature values that also reduce or eliminate noise associated with a sensor and circuitry of the thermometer 138. Control logic of the local media controller 135 can be adapted to direct clock and pulse generation that coordinates functionality of hardware of the thermometer 138 in addition to calibration efforts, as will be explained in detail.

Figure 1B:
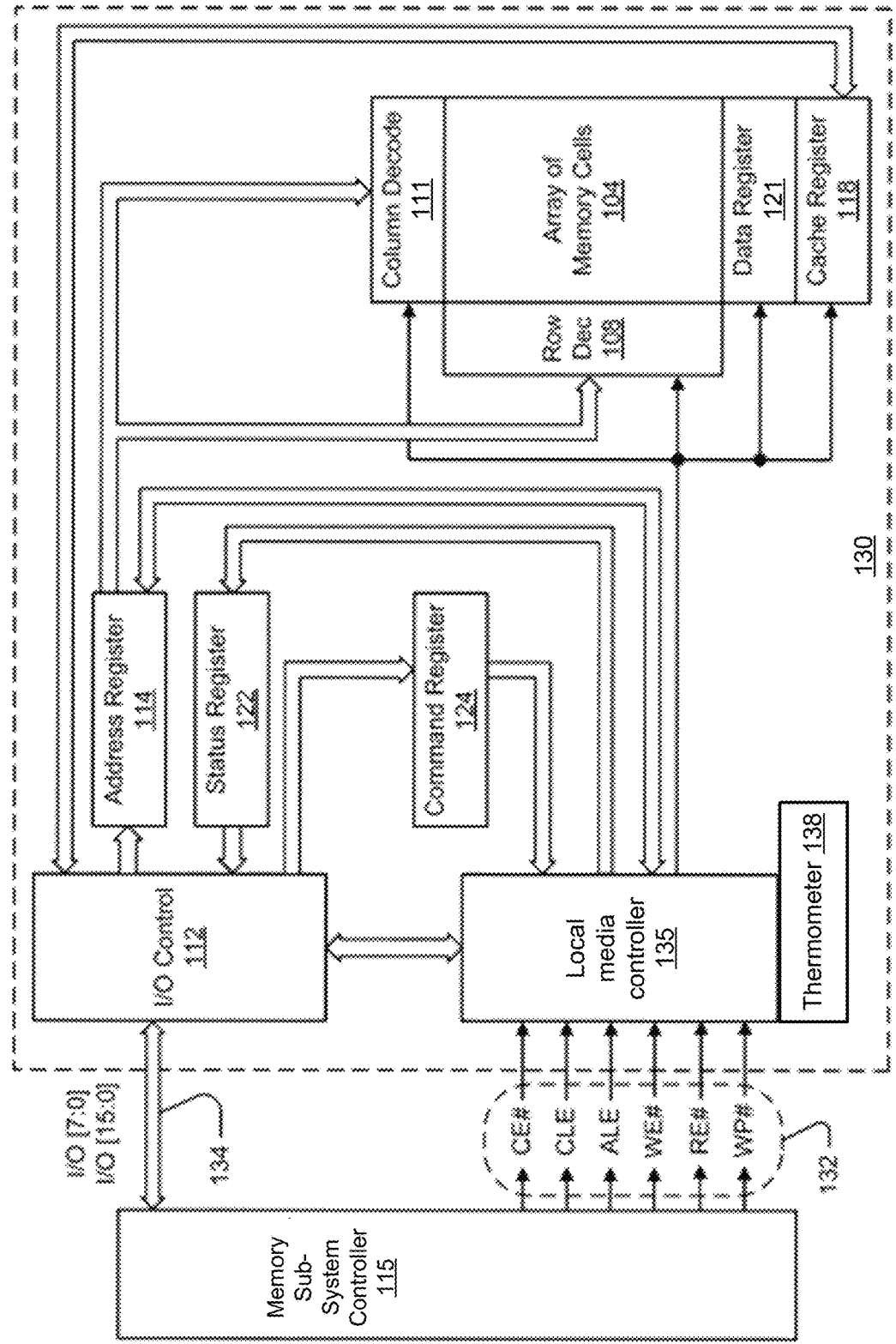
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, e.g., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) a page buffer of the memory device 130. The page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115. In some embodiments, the local media controller 135 includes or is coupled with the thermometer 138, which will be discussed in detail.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
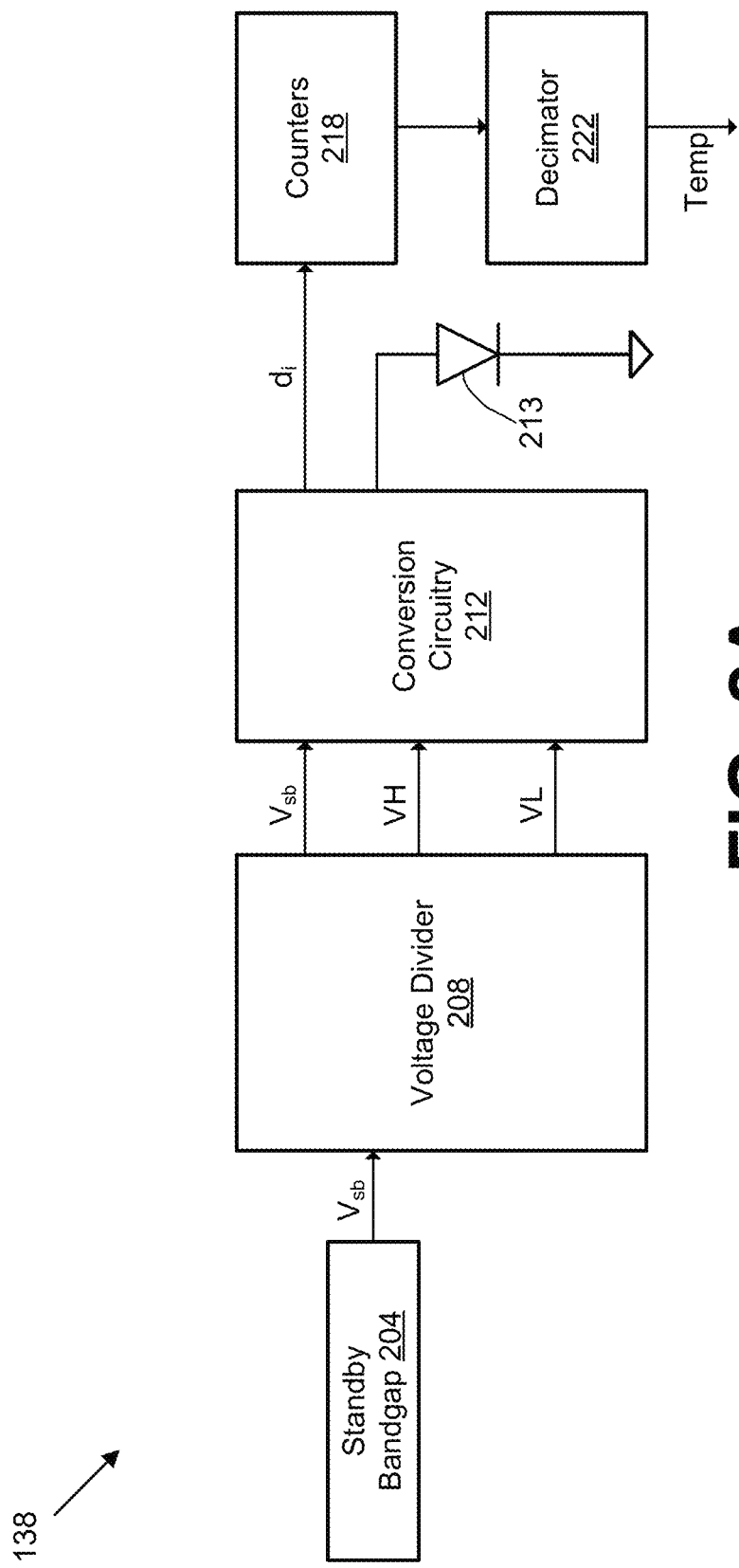
FIG. 2A is a schematic block diagram of the thermometer of FIGS. 1A-1B according to at least some embodiments.

FIG. 2A is a schematic block diagram of the thermometer 138 of FIGS. 1A-1B according to at least some embodiments. In various embodiments, the thermometer 138 includes a standby bandgap circuit 204, a voltage divider circuit 208, conversion circuitry 212, a diode 213, counters 218, and a decimator 222, which outputs a measured temperature value. The temperature value, as discussed, can be a digital code provided to the local media controller 135 that control logic of the local media controller 135 can interpret.

In at least some embodiments, the diode 213 is representative of forward-biased p-type/n-type (PN) junction that has a threshold voltage (Vd) across a depletion region between n-type and p-type semiconductor regions. This threshold voltage (Vd) varies with temperature and can therefore function as a temperature sensor to other circuitry within the thermometer 138.

In at least some embodiments, the standby bandgap circuit 204 is adapted to generate a temperature independent voltage reference, hereinafter referred to as a standby bandgap voltage ($V_{sb}$). Because the standby bandgap voltage is temperature independent, the voltage divider circuit 208 can act on a reliably-consistent voltage level to generate high voltage reference (VH) and low voltage reference (VL) voltages. The conversion circuitry 212 can then use these high and low voltage reference values to average comparisons with the threshold voltage (Vd) of the diode in generation of conversion outputs ($d_i$).

In these embodiments, the counters 218 can then track these conversion outputs in additional to clock cycles. Upon reaching the end of another conversion cycle, which can be quantified by a predetermined number of clock cycles, the decimator 222 can decimate the total number of conversion outputs to reduce noise in a final temperature value output by the thermometer 138. How these components function will be discussed in more detail.

Figure 2B:
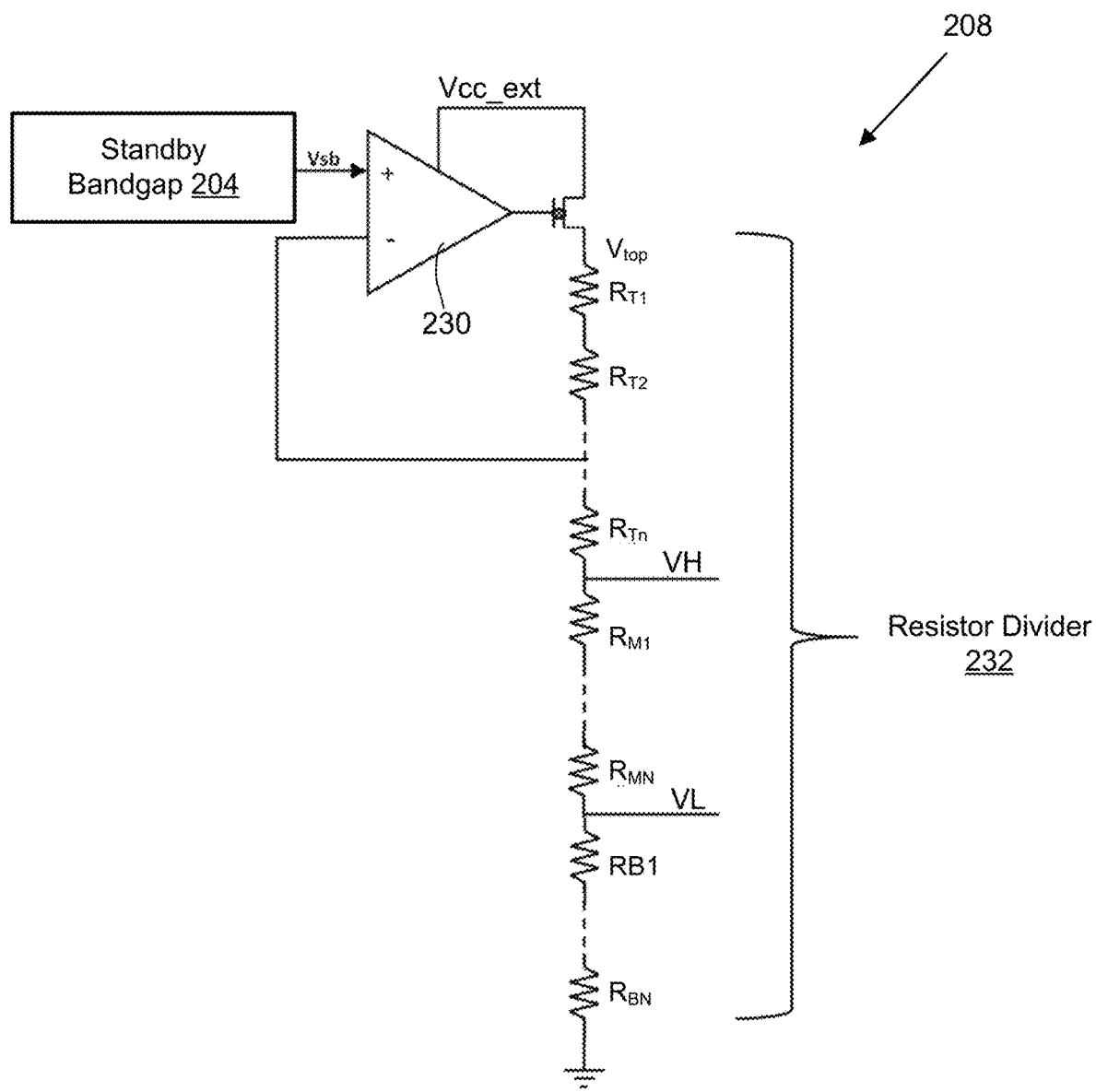
FIG. 2B is a schematic diagram of the voltage divider of FIG. 2A according to an embodiment.
Figure 4:
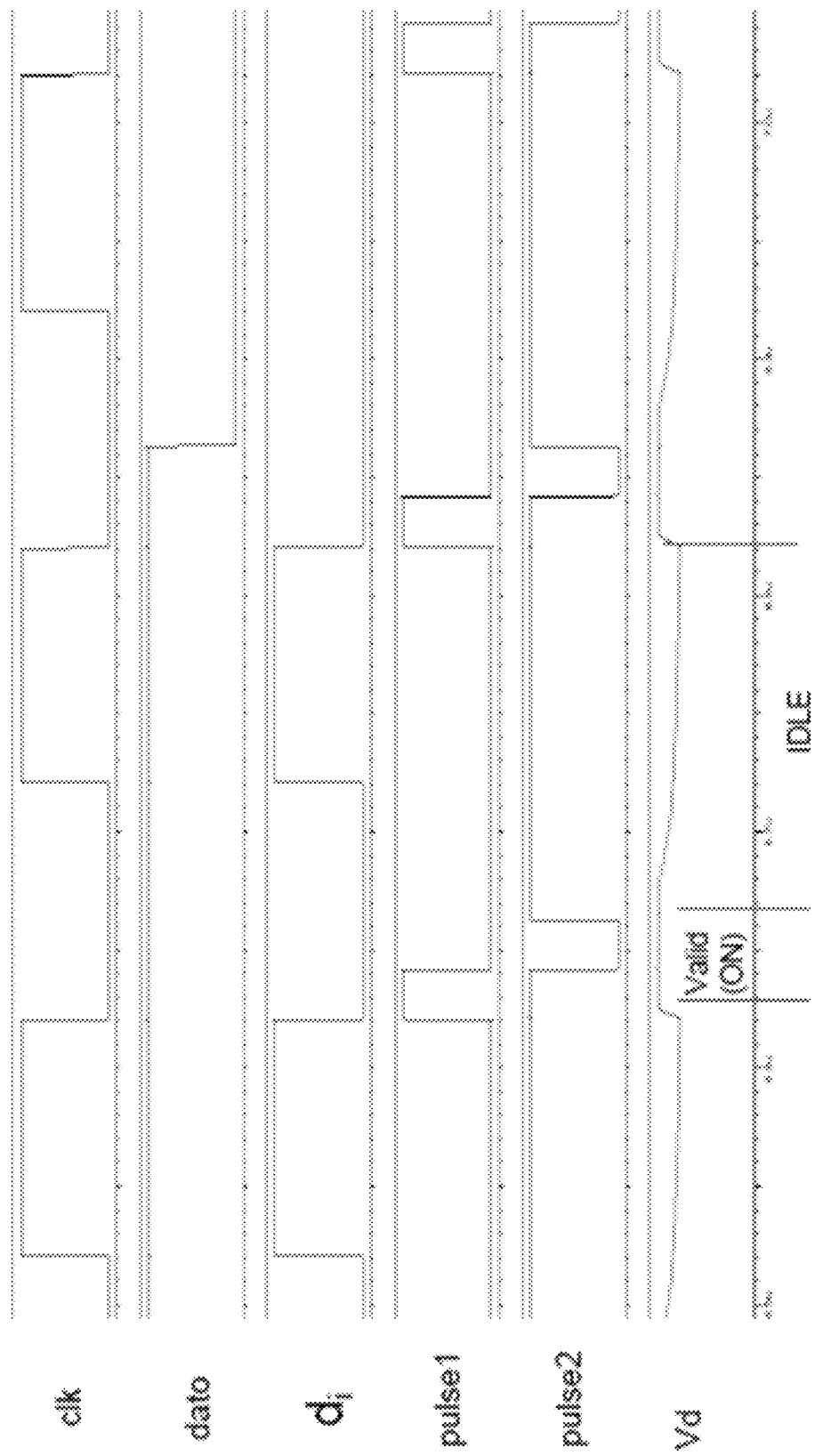
FIG. 4 is a graph of waveforms associated with the schematics of FIGS. 3C-3D according to at least some embodiments.

FIG. 2B is a schematic diagram of the voltage divider circuit 208 of FIG. 2A according to an embodiment. In some embodiments, the voltage divider circuit 208 includes a low current voltage buffer 230 coupled with a resistor divider 232. Because the active phases of temperature conversion are significantly shorter than idle phases as illustrated in FIG. 4, in addition to the low operating current of the voltage divider circuit 208, the voltage divider circuit 208 enables limiting current consumption of the thermometer 138. Further, the resistor divider 232 is able to generate low current consuming high voltage and low voltage references, VH and VL. The values for VH and VL voltages can be variably set depending on a tap point taken for the VH and VL voltages along the resistor divider 232.

Figures 3C, 3D:
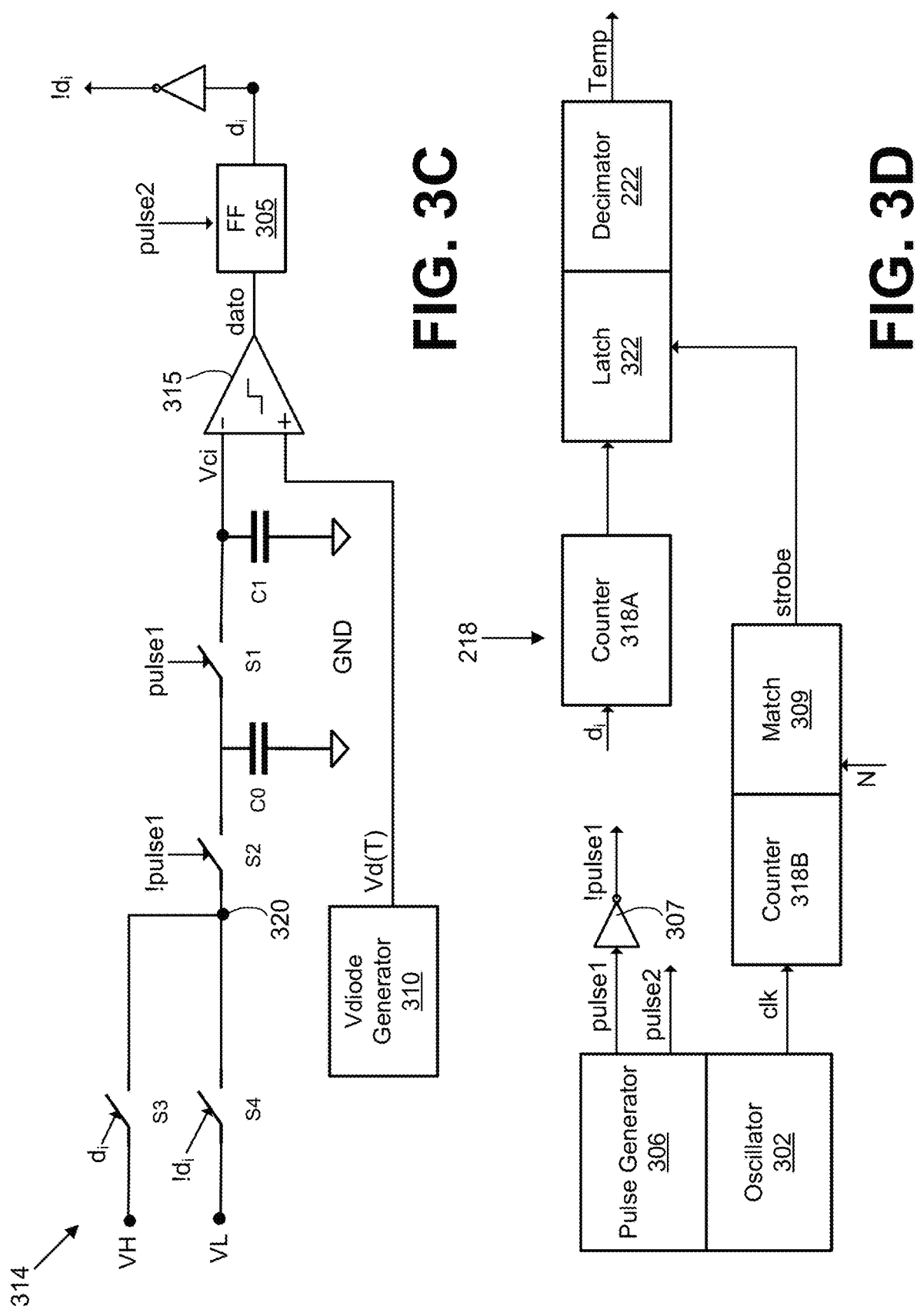
FIG. 3C is a schematic diagram of the analog-to-digital converter (ADC) of FIG. 3A according to some embodiments.
FIG. 3D is a schematic block diagram of the counters and decimator for determining temperature from the ADC according to at least some embodiments.

FIG. 3A is a schematic block diagram of the conversion circuitry 212 in the context of the thermometer of FIG. 2A according to at least some embodiments. The conversion circuitry 212 can include an oscillator 302, a pulse generator 306, a Vdiode generator 310, and an analog-to-digital converter (ADC) 314. The oscillator 302, which can be a low-voltage oscillator, can generate a clock (CLK) that drives the pulse generator 306 among other circuitry illustrated in FIGS. 3C-3D. The Vdiode generator 310 can determine the threshold voltage (Vd) of the diode 213 or of other forward biased PN junction semiconductor device and provide the threshold voltage to the ADC 314. The ADC 314 can operate using a combination of one or more of the VH and VL values from the voltage divider circuit 208 in comparison to the threshold voltage (Vd) of the diode 213.

More specifically, the output of the ADC 314 can be understood as a number of one values triggered by the ADC 314 in making this comparison, which can be expressed as the value K in the below Equation (1). The value of N in Equation (1) is the number of conversions made during the time the clock generated by the oscillator 302 reaches the predetermined number of clock cycles. Thus, the total number of conversion outputs can become more accurate with an increased number of clock cycles.

$$K = \frac{Vd - VL}{VH - VL} \cdot N \qquad (1)$$

The ADC 314 will be discussed in more detail with reference to FIGS. 3C-3D.

FIG. 3B is a graph illustrating the threshold voltage (Vd) of the diode 213 that changes with respect to temperature within the thermometer 138 according to at least some embodiments. For example, it can be observed from this graph that Vd is generally inversely proportional to temperature (T). As illustrated, a maximum threshold voltage ($Vd_{max}$), corresponding to a minimum temperature (Tmin), can be set that is lower than the voltage of the high voltage reference (VH). Further, a minimum threshold voltage ($Vd_{min}$), corresponding to a maximum temperature (Tmax), can be set that is higher than the voltage of the low voltage reference (VL). Additionally, choices of voltages the VH and VL values can be made taking into account the considerations of Equations (2) and (3), respectively, in the design of the voltage divider 208 (FIG. 2B) and choice of tap locations from the resistor divider 232.

$$V_H = V_{top} \frac{\sum_1^n R_M + \sum_1^n R_B}{\sum_1^n R_T + \sum_1^n R_M + \sum_1^n R_B} > Vd_{max} \qquad (2)$$

$$V_L = V_{top} \frac{\sum_1^n R_B}{\sum_1^n R_T + \sum_1^n R_M + \sum_1^n R_B} < Vd_{min} \qquad (3)$$

Accordingly, the voltage of the high voltage reference (VH) can be selected to be higher than a maximum value of the threshold voltage, and the voltage of the low voltage reference (VL) can be selected to be lower than a minimum value of the threshold voltage.

FIG. 3C is a schematic diagram of the ADC 314 of FIG. 3A according to some embodiments. FIG. 3D is a schematic block diagram of the counters 218 and the decimator 222 for determining temperature from the ADC 314 according to at least some embodiments. FIG. 4 is a graph of waveforms associated with the schematics of FIGS. 3C-3D according to at least some embodiments. The ADC 314 can include, but not be limited to, a voltage comparator 315, a first capacitor C1, a second capacitor C0, a first switch S1, a second switch S2, a third switch S3, a fourth switch S4, and a flip flop 305.

In at least some embodiments, the voltage comparator 315 has a positive terminal coupled with the diode 213, e.g., via the Vdiode generator 310. The first capacitor C1 is coupled between a negative terminal of the voltage comparator 315 and ground (GND). The first switch S1 is coupled between the first and the second capacitors, and selectively couples the first capacitor with the second capacitor. The second switch S2 is coupled between the second capacitor and a voltage reference node 320, and selectively couples the second capacitor with the voltage reference node 320. The second capacitor C0 is selectively connected between the first switch S1 and the second switch S3, the second capacitor C0 also coupled to the ground. In these embodiments, the second capacitor C0 is smaller than the first capacitor C1. In some embodiments, the first capacitor C1 is much larger than the second capacitor C0.

In at least some embodiments, the oscillator 302 is coupled with the pulse generator 306. The oscillator 302 can provide a clock from which the pulse generator 306 generates pulses (pulse1). In these embodiments, the pulse generator 306 (FIG. 3D) is coupled with the ADC 314 and generates the pulses (pulse1) that are to close the first switch S1, causing the first capacitor C1 and the second capacitor C0 to equalize charge. In these embodiments, the thermometer 138 further includes an inverter 307 (FIG. 3D) coupled between the pulse generator 306 and the second switch S2. The inverter 307 can output an inverted signal (!pulse1) that is to close the second switch S2, causing the second capacitor C0 to be pre-charged via the voltage reference node 320. As illustrated in FIG. 4, the inverted signal has inverted pulses of the pulse1 signal that are longer and thus the pre-charge period is more lengthy. Once the second capacitor C0 is pre-charged, a pulse from the pulse1 signal causes the first switch S1 to close while the second switch S2 is forced open, causing the charge to equalize across the first and second capacitors.

In various embodiments, the ADC 314 further includes a third switch S3, which is coupled between the high voltage reference (VH) of the resistor divider 232 and the voltage reference node 320, and selectively couples the high voltage reference (VH) of the resistor divider 232 with the voltage reference node 320. In these embodiments, the resistor divider 232 is driven by a standby bandgap voltage, as discussed. The ADC 314 further includes a fourth switch S4, which is coupled between the low voltage reference (VL) of the resistor divider 232 and the voltage reference node 320, and selectively couples the low voltage reference (VL) of the resistor divider 232 with the voltage reference node 320. Further, the voltage of the low voltage reference is lower that of the high voltage reference. Thus, during the pre-charge phase, an asserted conversion output ($d_i$) (e.g., a one value) causes the third switch to close to choose VH while an un-asserted conversion output ($!d_i$) (e.g., a zero value) causes the fourth switch to close to choose VL to feed to the voltage reference node 320. As illustrated in FIG. 4, $d_i$ can generally correspond to the clock (CLK) during at least part of the temperature conversions.

In at least some embodiments, the flip flop 305 is coupled with the voltage comparator 315 to store an output ($d_i$) of the voltage comparator 315. The output is to selectively close the third switch S3 and a second inverted signal ($!di$) of the output is to selectively close the fourth switch S4, e.g., so that only one of the third switch S3 or the fourth switch S4 is closed at a time. In these embodiments, the pulse generator 306 further generates second pulses (pulse2). The flip flop 305 can store the output ($d_i$) of the voltage comparator 315 and can be cleared in an absence of the second pulses (pulse2), as illustrated with reference to FIG. 4.

With additional specificity regarding the pre-charge phase, while the first switch S1 is open and the second switch S2 is closed, the second capacitor C0 is charged to either the high voltage reference (VH) level or the low voltage reference (VL) level depending on the conversion output $d_i$ currently stored in the flip flop 305. The voltage on the first capacitor C1 is Vci, which after a period of ramping, alternates around close to the threshold voltage (Vd) of the diode 213. The charges on the capacitors after the pre-charge phase can be expressed as $Q_f$ in Equation (4), $$Q_s = C_0 \cdot (d_i \cdot VH + (1-d_i) \cdot VL) + C_1 \cdot Vc_i \quad (4)$$

where the first value is the charge on the second capacitor C0 and the second value is the charge on the first capacitor C1.

With additional specificity regarding the join phase, while the first switch S1 is closed and the second switch S2 is open, the first capacitor C1 and the second capacitor C0 equalize charge to share a common voltage $V_f$. Thus the charge on the second capacitor C0 will either be added to the charge on the first capacitor C1 (when pre-charge occurred at VH), or the opposite will happen, and the second capacitor C0 will accept charge from the first capacitor C1 (when the pre-charge occurred at VL). The final charge $Q_f$ can be expressed as in Equation (5)

$$Q_f = (C_0 + C_1) \cdot Vf_i. \quad (5)$$

Further, assuming that $Q_s$ will equal $Q_f$ after each conversion, one can sequentially generate Equations (6) and (7).

$$V_{f_i} = \frac{C_0}{C_0+C_1}(d_i \cdot VH + (1-d_i) \cdot VL) + \frac{C_1}{C_0+C_1} Vc_i \quad (6)$$

$$\Delta V_i = V_{f_i} - V_{C_i} = \frac{C_0}{C_0+C_1}(d_i \cdot VH + (1-d_i) \cdot VL - Vc_i) \quad (7)$$

Considering the steady state of $\Sigma_{i=0}^{N} \Delta V_i = 0$, putting $K = \Sigma_{i=0}^{N} d_i$ and $(n-k) = \Sigma_{i=0}^{N}(1-d_i)$, where K is the number of one values output by the ADC 314 (and is proportional to the temperature of the diode 213) and N is the number of conversions or clock cycles. Considering also that $\Sigma_{i=0}^{N} V_i = N \cdot Vd$, Equations (8) and (9) can be obtained:

$$k \cdot VH + (N-k) \cdot VL - N \cdot Vd = 0, \text{ then} \quad (8)$$

$$K = \frac{Vd - VL}{VH - VL} \cdot N, \quad (9)$$

where Equation (9) is the same as Equation (1) referred to earlier, having a resolution or $$\frac{VH - VL}{N}.$$

As a practical example only for purposes of explanation, assume a Vc voltage of 600 mV, which is lower than Vd(T) at an assumed value of approximately 1.2 V. Based on this information, the output $d_i$ of the voltage comparator 315 will be a "1" (one value) to the flip flop 305; otherwise, if Vc is higher than Vd(T), the voltage comparator 315 will output a "0" (zero value) to the flip flop 305. During a ramping phase, the voltage comparator output is "1" and the second capacitor C0 voltage is continued to be put on C1, which grows in charge and thus increases the voltage at Vci. During steady state phase, the Vc (from C1) increases higher than Vd, then the conversion output $d_i$ is "0," reducing the voltage at Vc. The voltage Vc is made lower by making the conversion output $d_i$ go low, pre-charging the second capacitor C0 to a lower voltage, which then removes voltage from first capacitor C1 during the join phase. The voltage Vc then can start dithering throughout steady state phase around Vd.

With additional reference to FIG. 3D, according to at least some embodiments, the counters 218 (FIG. 3D) include a first counter 318A coupled with the flip flop 305, a second counter 318B coupled with the oscillator 302, a match circuit 309 coupled with the second counter 318B and to trigger a strobe of the value of the first counter 318A into a latch 322 coupled with the first counter 318A. For example, in these embodiments, the first counter 318A is incremented in response to detecting a one value buffered in the flip flop 305, and the second counter 318B is incremented according to clock cycles of the clock (CLK) generated by the oscillator 302. The latch 322 is coupled with the output of the first counter 318A. A logic gate of the match circuit 309 activates the latch 322, which receives a value of the first counter 318A, in response to the second counter 318B reaching a predetermined number of clock cycles, indicated as N.

In at least some embodiments, the decimator 222 is coupled to the latch 322, and thus is adapted to decimate the value retrieved from the latch 322, causing the discarding of a predetermined number of least significant bits of the value of the first counter 318A stored in the latch 322. The decimator 222 thus outputs a decimated value for the temperature that rejects noise found in the least significant bits. The output temperature value can be in the form of a digital code that control logic of the local media controller 135 can interpret.

Figure 5A:
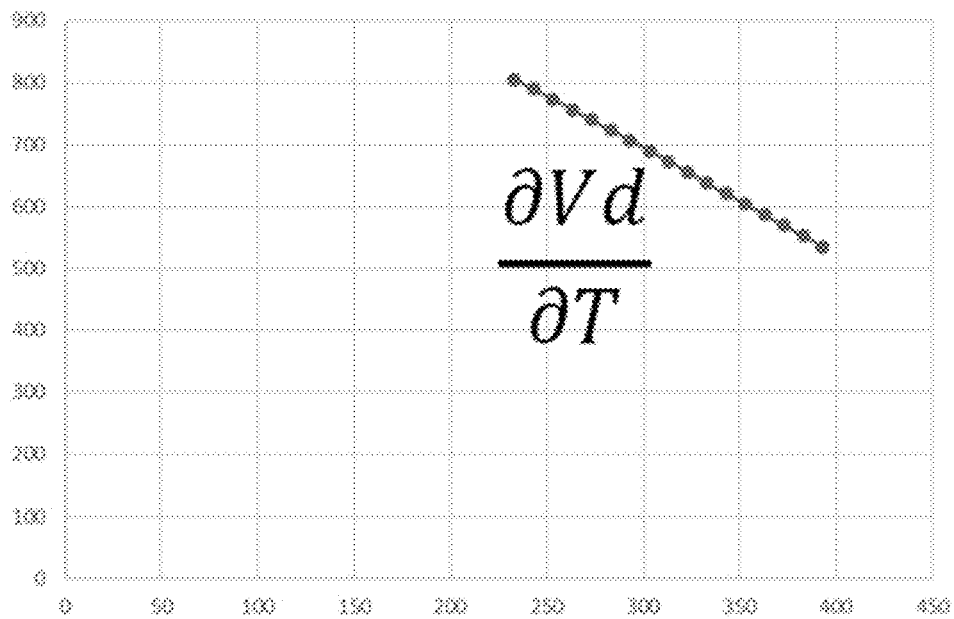
FIG. 5A is a graph illustrating a change in the threshold voltage of the diode versus temperature according to various embodiments.

FIG. 5A is a graph illustrating a change in the threshold voltage of the diode versus temperature according to various embodiments. In these embodiments, this change in threshold voltage (Vd) of the diode 213 can be expressed as Equation (10).

$$\frac{\partial Vd}{\partial T} = 2^j \cdot \frac{VH - VL}{N} \quad (10)$$

The digital codes can be made to correspond to this change in threshold voltage according to temperature, employing the value of j in Equation (10) to adjust the resolution of the curve defined by the change of Vd over temperature. For example, if j is set to zero ("0"), there will be 1 code/degree, whereas if j is set to one ("1"), there will be 2 codes/degree. Increases in the resolution per degree can help with accuracy, for example. Accordingly, as the value of j is increased, the least significant bits that are discarded by the decimator 222 are increased to reject more noise. Further, as can be observed, the value of N (number of conversion cycles employed before performing decimation), dictates the slope of the Vd versus temperature (T) curve and thus can be adjusted to set a rate of change between Vd and temperature in temperature output values from the decimator 222. The particular curve of FIG. 5A was generated using a value of N of 2200, a clock period of 10 μs, and a sample period of 22 ms, although others are envisioned.

Figure 5B:
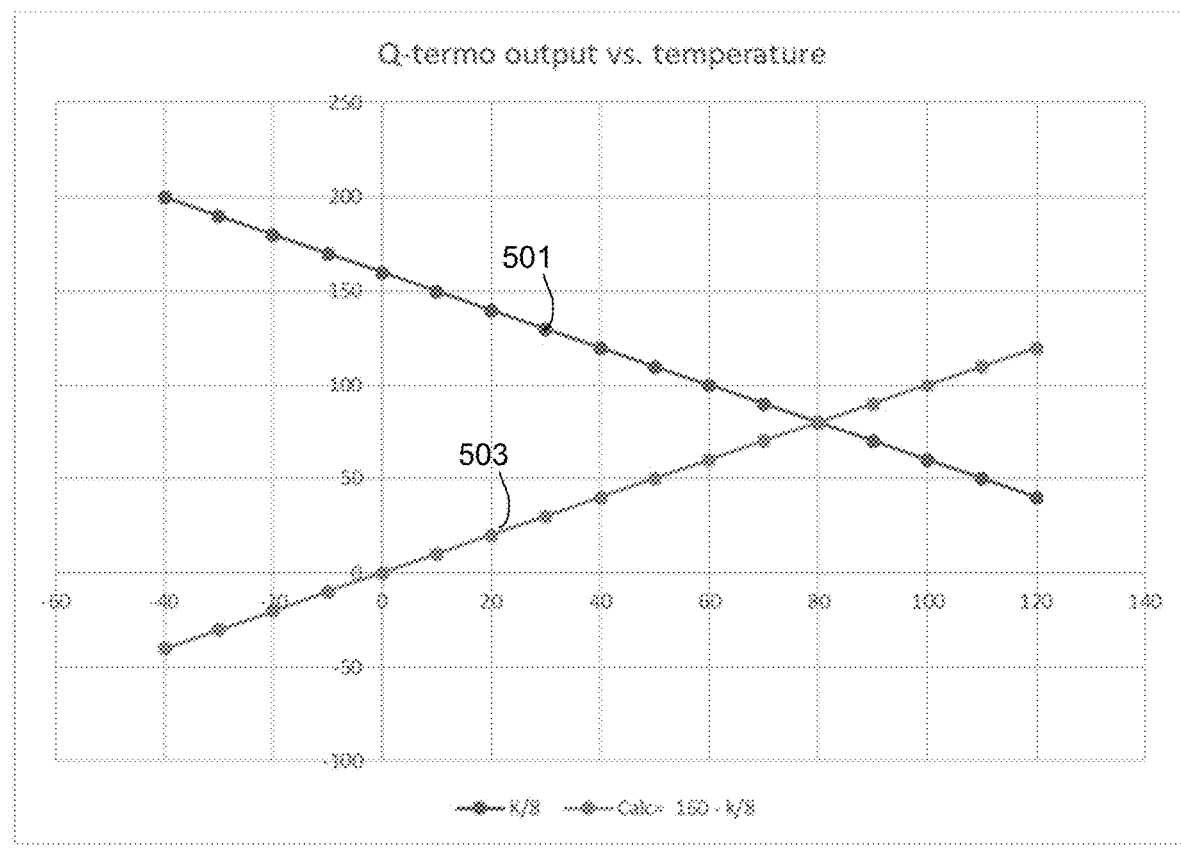
FIG. 5B is a graph illustrating calibration of decimation by the decimator according to at least some embodiments.

FIG. 5B is a graph illustrating calibration of decimation by the decimator 222 according to at least some embodiments. This graph illustrates a curve 501 of the value of K (e.g., number of ones tracked by the first counter 318A) divided by eight ("8") and a curve 503 of a calibration calculation of (160−K/8), which will match the temperature value of the diode 213. Thus, calibration can be obtained by adding the number needed to reach the target value, which is chosen to be P=160 in this example, but other numbers are envisioned and can be selected. Only by was as example, assume VH is 0.95V, VL is 0.45V, j is set to 3 (e.g., three least significant bits are truncated to obtain 1 code/degree), and the Vd slope is −1.82 mV/K. The control logic can create and store, within a data structure, something like Table 1 that associates temperature values with K/8 and the calibrated value of 160−K/8 for purposes of calibration. Thus, in this calibrated example, Equation (11) can be used to calculate the temperature based on the values of P, K, and j.

$$T = P - \frac{K}{2^j} \quad (11)$$

TABLE 1

| Temp (K.) | K/8 | (160 − K/8) |
|---|---|---|
| −40 | 200 | −40 |
| −30 | 190 | −30 |
| −20 | 180 | −20 |
| −10 | 170 | −10 |
| 0 | 160 | 0 |
| 10 | 150 | 10 |
| 20 | 140 | 20 |
| 30 | 130 | 30 |
| 40 | 120 | 40 |
| 50 | 110 | 50 |
| 60 | 100 | 60 |

TABLE 1-continued

| Temp (K.) | K/8 | (160 − K/8) |
|---|---|---|
| 70 | 90 | 70 |
| 80 | 80 | 80 |
| 90 | 70 | 90 |
| 100 | 60 | 100 |
| 110 | 50 | 110 |
| 120 | 40 | 120 |

FIG. 6 is a flow diagram of an example method 600 of operating the thermometer 138 of the memory device according to at least some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by a combination of the thermometer 138 and the local media controller 135 of FIGS. 1A-1B, and discussed in more detail herein. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In various embodiments, the method 600 is of operating a memory device that includes a memory array, a diode having a threshold voltage that changes with temperature, and an analog-to-digital converter (ADC) coupled with the memory array. In these embodiments, the ADC includes a voltage comparator having a positive terminal coupled with the diode, a first capacitor coupled between a negative terminal of the voltage comparator and ground, and a second capacitor selectively coupled between the first capacitor and a voltage reference node, the second capacitor also coupled with the ground and having a smaller capacitance than that of the first capacitor.

At operation 610, a pulse generated is controlled. More specifically, the processing logic directs the pulse generator to generate pulses, where the pulses are to cause the first capacitor to connect to the second capacitor and equalize charge between the first capacitor and the second capacitor.

At operation 620, an inverted signal of the pulses is generated. More specifically, the processing logic generates, from the pulses, an inverted signal that is to cause the second capacitor to be coupled with the voltage reference node to precharge the first capacitor before equalization of the charge between the first capacitor and the second capacitor.

At operation 630, comparator outputs are tracked. More specifically, the processing logic tracks a number of one values output by the voltage comparator to determine a temperature value of the diode.

In some embodiments, an oscillator coupled with the pulse generator of the thermometer 138. In additional operations of method 600, the processing logic tracks, using a first counter, the number of one values output by the voltage comparator. The processing logic further generates, using the oscillator, a clock from which the pulse generator generates the pulses. The processing logic further tracks, using a second counter, a number of clock cycles of the clock. The processing logic further, in response to the second counter reaching a predetermined number of clock cycles, decimates a value of the first counter to generate the temperature value.

Figure 7:
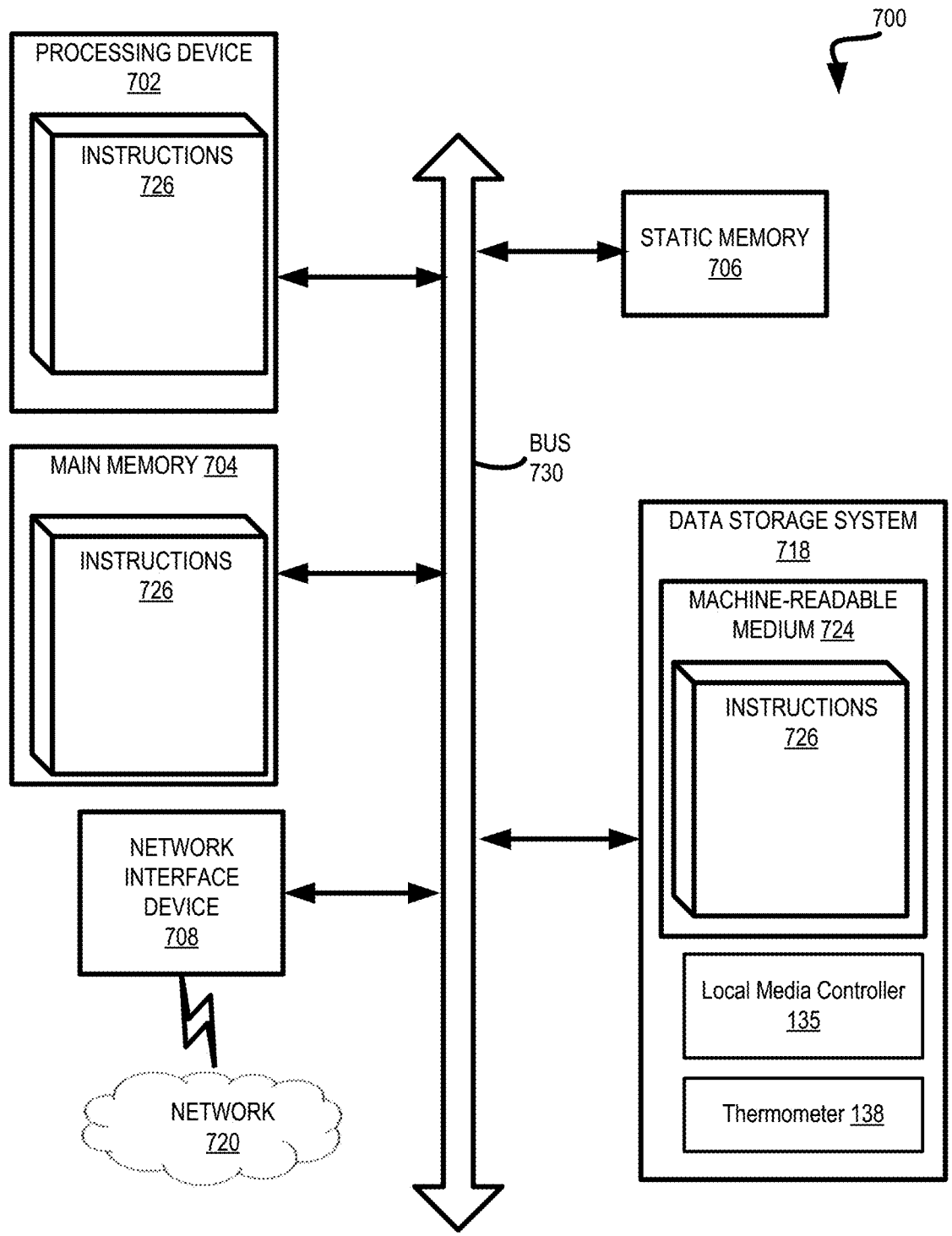
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 710 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 728 for performing the operations and steps discussed herein. The computer system 700 can further include a network interface device 712 to communicate over the network 720.

The data storage system 718 can include a machine-readable storage medium 724 (also known as a computer-readable medium) on which is stored one or more sets of instructions 728 or software embodying any one or more of the methodologies or functions described herein. The data storage system 718 can further include the local media controller 135 and the thermometer 138 that were previously discussed. The instructions 728 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a controller (e.g., the memory sub-system controller 115 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
an array of memory cells;
a diode having a threshold voltage that changes with temperature;
an analog-to-digital converter (ADC) coupled with the array and comprising:
a voltage comparator having a positive terminal coupled with the diode;
a first capacitor coupled between a negative terminal of the voltage comparator and ground; and
a second capacitor selectively coupled between the first capacitor and a voltage reference node, the second capacitor also coupled with the ground and having a smaller capacitance than that of the first capacitor; and
a pulse generator coupled with the ADC and to generate pulses, wherein the pulses are to cause the first capacitor to connect to the second capacitor and equalize charge between the first capacitor and the second capacitor, and wherein an inverted signal of the pulses is to cause the second capacitor to be coupled with the voltage reference node to pre-charge the first capacitor.

2. The memory device of claim 1, further comprising an oscillator coupled with the pulse generator, the oscillator to provide a clock from which the pulse generator is to generate the pulses.

3. The memory device of claim 1, further comprising:
a first switch coupled with the first capacitor, wherein the pulses are to close the first switch; and
a second switch coupled between the first switch and the voltage reference node, wherein the inverted signal is to close the second switch.

4. The memory device of claim 1, further comprising:
a first switch coupled between a high voltage reference of a resistor divider and the voltage reference node, the resistor divider being driven by a standby bandgap voltage; and
a second switch coupled between a low voltage reference of the resistor divider and the voltage reference node, wherein a voltage of the low voltage reference is lower than that of the high voltage reference.

5. The memory device of claim 4, wherein the voltage of the high voltage reference is selected to be higher than a maximum value of the threshold voltage, and wherein the voltage of the low voltage reference is selected to be lower than a minimum value of the threshold voltage.

6. The memory device of claim 4, further comprising a flip flop coupled with the voltage comparator to store an output of the voltage comparator, wherein the output is to selectively close the first switch and a second inverted signal of the output is to selectively close the second switch.

7. The memory device of claim 1, wherein the pulse generator further generates second pulses, further comprising a flip flop coupled with the voltage comparator, the flip flop to store an output of the voltage comparator and to be cleared in an absence of the second pulses.

8. The memory device of claim 7, further comprising:
an oscillator to generate a clock from which the pulse generator is to generate the pulses;
a first counter coupled with the flip flop, the first counter to be incremented in response to detecting a one value buffered in the flip flop;
a second counter coupled with the oscillator, the second counter to be incremented according to clock cycles of the clock;
a latch coupled with an output of the first counter; and
a logic gate to activate the latch, which receives a value of the first counter, in response to the second counter reaching a predetermined number of clock cycles.

9. The memory device of claim 8, further comprising a decimator coupled with the latch, the decimator to:
cause discarding of a predetermined number of least significant bits of the value of the first counter stored in the latch; and
output a decimated value for the temperature that rejects noise found in the least significant bits.

10. A system comprising:
one or more memory dice;
a diode having a threshold voltage that changes with temperature;
an analog-to-digital converter (ADC) coupled with the one or more memory dice, the ADC comprising:
a voltage comparator having a positive terminal coupled with the diode;
a first capacitor coupled between a negative terminal of the voltage comparator and ground;
a first switch coupled with the first capacitor;
a second switch coupled between the first switch and a voltage reference node; and
a second capacitor connected between the first switch and the second switch, the second capacitor also coupled with the ground;
a pulse generator coupled with the ADC, the pulse generator to generate pulses that are to close the first switch, causing the first capacitor and the second capacitor to equalize charge; and
an inverter coupled between the pulse generator and the second switch, the inverter to output an inverted signal that is to close the second switch, causing the second capacitor to be pre-charged via the voltage reference node.

11. The system of claim 10, wherein the second capacitor is smaller than the first capacitor.

12. The system of claim 10, further comprising an oscillator coupled with the pulse generator, the oscillator to provide a clock from which the pulse generator is to generate the pulses.

13. The system of claim 10, further comprising:
a third switch coupled between a high voltage reference of a resistor divider and the voltage reference node, the resistor divider being driven by a standby bandgap voltage; and
a fourth switch coupled between a low voltage reference of the resistor divider and the voltage reference node, wherein a voltage of the low voltage reference is lower than that of the high voltage reference.

14. The system of claim 13, wherein the voltage of the high voltage reference is selected to be higher than a maximum value of the threshold voltage, and wherein the voltage of the low voltage reference is selected to be lower than a minimum value of the threshold voltage.

15. The system of claim 13, further comprising a flip flop coupled with the voltage comparator to store an output of the voltage comparator, wherein the output is to selectively close the third switch and a second inverted signal of the output is to selectively close the fourth switch.

16. The system of claim 10, wherein the pulse generator further generates second pulses, further comprising a flip flop coupled with the voltage comparator, the flip flop to store an output of the voltage comparator and to be cleared in an absence of the second pulses.

17. The system of claim 16, further comprising:
an oscillator to generate a clock from which the pulse generator is to generate the pulses;
a first counter coupled with the flip flop, the first counter to be incremented in response to detecting a one value buffered in the flip flop;
a second counter coupled with the oscillator, the second counter to be incremented according to clock cycles of the clock;
a latch coupled with an output of the first counter; and
a logic gate to activate the latch, which receives a value of the first counter, in response to the second counter reaching a predetermined number of clock cycles.

18. The system of claim 17, further comprising a decimator coupled with the latch, the decimator to:
cause discarding of a predetermined number of least significant bits of the value of the first counter stored in the latch; and
output a decimated value for the temperature that rejects noise found in the least significant bits.

19. A method of operating a memory device comprising a memory array, a diode having a threshold voltage that changes with temperature, and an analog-to-digital converter (ADC) coupled with the memory array, the ADC comprising a voltage comparator having a positive terminal coupled with the diode, a first capacitor coupled between a negative terminal of the voltage comparator and ground, and a second capacitor coupled between the first capacitor and a voltage reference node, the second capacitor also coupled with the ground and having a smaller capacitance than that of the first capacitor, and wherein the method of operating the memory device comprises:
directing a pulse generator to generate pulses, wherein the pulses are to cause the first capacitor to connect to the second capacitor and equalize charge between the first capacitor and the second capacitor;
generating, from the pulses, an inverted signal that is to cause the second capacitor to be coupled with the voltage reference node to precharge the first capacitor before equalization of the charge between the first capacitor and the second capacitor; and
tracking a number of one values output by the voltage comparator to determine a temperature value of the diode.

20. The method of claim 19, wherein the memory device further comprises an oscillator coupled with the pulse generator, and wherein the method of operating the memory device further comprises:
tracking, using a first counter, the number of one values output by the voltage comparator;
generating, using the oscillator, a clock from which the pulse generator generates the pulses;
tracking, using a second counter, a number of clock cycles of the clock; and
in response to the second counter reaching a predetermined number of clock cycles, decimating a value of the first counter to generate the temperature value.

* * * * *